United States Patent
Samuels (10) Patent No.: US 6,777,146 B1
(45) Date of Patent: Aug. 17, 2004

(54) METHOD OF OPTICAL PROXIMITY CORRECTION WITH SUB-RESOLUTION ASSISTS

(75) Inventor: Donald J. Samuels, Silverthorne, CO (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/248,815

(22) Filed: Feb. 21, 2003

(51) Int. Cl.[7] .................................................. G03F 9/00
(52) U.S. Cl. .............................. 430/30; 430/5; 716/19; 716/21
(58) Field of Search .................. 430/5, 30; 716/19, 716/21

(56) References Cited

U.S. PATENT DOCUMENTS

| | | |
|---|---|---|
| 5,725,974 A | 3/1998 | Kawahira |
| 5,821,014 A | 10/1998 | Chen et al. |
| 5,862,058 A | 1/1999 | Samuels et al. |
| 5,866,913 A | 2/1999 | Robinson |
| 5,900,340 A | 5/1999 | Reich et al. |
| 5,965,306 A | 10/1999 | Mansfield |
| 6,022,644 A | 2/2000 | Lin et al. |
| 6,077,310 A | 6/2000 | Yamamoto et al. |
| 6,081,658 A | 6/2000 | Rieger et al. |
| 6,114,071 A | 9/2000 | Chen et al. |
| 6,120,952 A | 9/2000 | Pierrat et al. |
| 6,120,953 A | 9/2000 | Lin |
| 6,139,994 A | 10/2000 | Broeke |
| 6,171,731 B1 | 1/2001 | Medvedeva et al. |
| 6,175,953 B1 | 1/2001 | Scepanovic et al. |
| 6,183,916 B1 | 2/2001 | Kuo et al. |
| 6,194,104 B1 | 2/2001 | Hsu |
| 6,197,456 B1 | 3/2001 | Aleshin et al. |
| 6,214,494 B1 | 4/2001 | Bula et al. |

Primary Examiner—Christopher G. Young
(74) Attorney, Agent, or Firm—Schmeiser, Olsen & Watts; Steven Capella (57) ABSTRACT

A first aspect of the present invention is a method of determining an optical proximity correction for a primary feature having sub-resolution assist features for increasing the depth of focus of the primary features, comprising: generating a line/space pair; placing sub-resolution assist features on opposite sides of the line of the line/space pair; generating a set of linewidth biases; applying the set of linewidth biases to the line of the line/space pair to generate a set of biased-line/space pairs; determining for each biased-line/space pair, a deviation from a design linewidth of the line/space pair when the set of biased-line/space pairs are printed or simulated; and determining from the deviation a correction bias to apply to the line of the line/space pair. The invention also encompasses apparatus and computer programs for carrying out the methods.

23 Claims, 9 Drawing Sheets

DEVIATION FROM DESIGN NOMINAL

| S | L | -70 | -60 | -50 | -40 | -30 | -20 | -10 | 0 | 10 | 20 | 30 | 40 | 50 | 60 | 70 |
|---|---|---|---|---|---|---|---|---|---|---|---|---|---|---|---|---|
| 150 | 150 | x | x | -120 | -82 | -58 | -39 | -20 | 0 | 23 | 55 | 120 | x | x | x | x |
| 150 | 175 | -126 | -98 | -79 | -63 | -49 | -34 | -18 | 1 | 26 | 62 | x | x | x | x | x |
| 150 | 200 | -99 | -85 | -73 | -60 | -47 | -33 | -17 | 4 | 33 | 82 | x | x | x | x | x |
| 150 | 225 | -95 | -84 | -73 | -61 | -48 | -33 | -15 | 10 | 47 | x | x | x | x | x | x |
| 150 | 250 | -96 | -86 | -75 | -63 | -50 | -33 | -11 | 20 | 74 | x | x | x | x | x | x |
| 150 | 275 | -99 | -89 | -78 | -65 | -50 | -30 | -3 | 39 | x | x | x | x | x | x | x |
| 150 | 300 | -104 | -93 | -81 | -67 | -48 | -24 | 11 | 73 | x | x | x | x | x | x | x |
| 150 | 350 | -108 | -95 | -79 | -60 | -36 | -4 | 46 | x | x | x | x | x | x | x | x |
| 150 | 400 | -97 | -83 | -67 | -50 | -29 | -4 | 31 | 95 | x | x | x | x | x | x | x |
| 150 | 450 | -90 | -77 | -64 | -48 | -29 | -5 | 28 | 87 | x | x | x | x | x | x | x |
| 175 | 150 | x | x | -125 | -85 | -63 | -46 | -31 | -16 | -1 | 16 | 38 | 67 | 117 | x | x |
| 175 | 175 | -131 | -102 | -82 | -67 | -54 | -41 | -29 | -16 | 0 | 18 | 42 | 78 | x | x | x |
| 175 | 200 | -101 | -87 | -75 | -64 | -53 | -42 | -30 | -16 | 0 | 22 | 51 | 102 | x | x | x |
| 175 | 225 | -96 | -85 | -76 | -66 | -56 | -45 | -32 | -17 | 3 | 28 | 67 | x | x | x | x |
| 175 | 250 | -97 | -88 | -79 | -70 | -59 | -47 | -33 | -15 | 8 | 40 | 98 | x | x | x | x |
| 175 | 275 | -101 | -93 | -84 | -74 | -63 | -49 | -33 | -12 | -17 | 61 | x | x | x | x | x |
| 175 | 300 | -106 | -98 | -88 | -78 | -65 | -50 | -30 | -5 | 32 | 99 | x | x | x | x | x |
| 175 | 350 | -110 | -98 | -85 | -71 | -56 | -38 | -17 | 8 | 43 | 99 | x | x | x | x | x |
| 175 | 400 | -89 | -87 | -74 | -61 | -47 | -32 | -14 | 7 | 34 | 75 | x | x | x | x | x |
| 175 | 450 | -91 | -81 | -69 | -58 | -45 | -31 | -14 | 8 | 36 | 81 | x | x | x | x | x |

METHOD OF OPTICAL PROXIMITY CORRECTION WITH SUB-RESOLUTION ASSISTS

BACKGROUND OF THE INVENTION

FIELD OF THE INVENTION

The present invention relates to the field of optical lithography; more specifically, it relates to a method for correcting line width deviations.

Fabrication of modern integrated circuits typically involves lithographic transfer of a pattern disposed on a mask onto to a layer of photoresist on a substrate. The pattern on the mask defines the integrated circuit patterns. It has been observed, especially as pattern sizes have decreased, that differences in similar patterns In the integrated circuit arise based on the proximity of patterns relative to one another. Therefore, various techniques for optical proximity correction (OPC) have been developed. It has also been observed, again as pattern sizes have decreased, that isolated and nested images focus differently in photolithographic exposure systems. Techniques, distinct from OPC, have been developed to address this problem. However, as pattern sizes continue to decrease well into the sub-micron region, linewidth control and image quality issues still continue to be a concern and improved methods for linewidth control and image quality are required.

SUMMARY OF INVENTION

A first aspect of the present invention is a method of determining an optical proximity correction for a primary feature having sub-resolution assist features for increasing the depth of focus of the primary features, comprising: generating a line/space pair; placing sub-resolution assist features on opposite sides of the line of the line/space pair; generating a set of linewidth biases; applying the set of linewidth biases to the line of the line/space pair to generate a set of biased-line/space pairs; determining for each biased-line/space pair, a deviation from a design linewidth of the line/space pair when the set of biased-line/space pairs are printed or simulated; and determining from the deviation a correction bias to apply to the line of the line/space pair.

A second aspect of the present invention is a method of determining a set of optical proximity correction rules for primary features having sub-resolution assist features for increasing the depth of focus of the primary features, comprising: generating a grating, the grating comprising sets of sets of line/space pairs, each set of line space/pairs comprising multiple copies of a unique combination of a linewidth value and a spacewidth value; generating a set of linewidth biases; for each line/space pair of a particular set of line/width pairs; selecting a sub-resolution assist features from a set of sub-resolution assist features based on the spacewidth value of the line/space pair of the particular set of line/space pairs; placing the sub-resolution assist features on either side of each line of each line/space pair of the particular set of line/space pairs; and applying a different linewidth bias of the set of linewidth bias to each line of each line/space pair of the particular set of line/space pairs; determining deviations from design linewidths of the sets of line/space pairs produced by the applying the different linewidth bias of the set of linewidth bias to each line of each line/space pair of the particular set of line/space pair; and generating from the deviations from the design linewidths of the set of line/space pairs the set of optical proximity correction rules.

A third aspect of the present invention is a method of optical proximity correction of primary features of a design having sub-resolution assist features for increasing the depth of focus of the primary features during operation of an optical lithography system by width biasing a light blocking layer on an optical mask, comprising: (a) selecting a set of line/space pairs representative of each the feature; (b) for each line/space pair of the set of line/space pairs; (i) generating, an identical set of line/space pairs representative of the feature; (ii) placing sub-resolution assist features on opposite sides of each line of each line/space pair, selection of the sub-resolution assist features based on linewidth and space values of the line/space pair; (iii) generating a set of linewidth biases; (iv) applying the a different linewidth bias of the set of linewidth biases to the line of each line/space pair to generate a set of biased-line/space pairs; (v) determining for each biased-line/width pair, a deviation from a design linewidth of the line/space pair when the set of biased-line/space pairs are printed or simulated; and (vi) determining from the deviations, a set of optical proximity correction rules corresponding to each line/space pair, each rule a correction bias; (c) selecting a feature from the primary features; (d) determining a corresponding line/space pair from the set of line/space pairs representative of the feature; (e) placing sub-resolution assist features on opposite sides of the feature, selection of the sub-resolution assist feature based on linewidth and space values of the line/space pair representative of the feature; (f) selecting a correction bias from the set of optical proximity correction rules, selection of the correction bias based on linewidth and space values of the line/space pair representative of the feature; and (g) applying the correction bias to the feature.

The invention also encompasses apparatus, systems and software for carrying out methods of the invention.

These and other aspects of the invention are described in further detail below.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

When the term line/space pair is used, it should be understood that the width of the line and the width of the space between the line and an adjacent line is being described. For the purposes of the present invention, a feature is defined as a line, a space or a line/space pair. It should also be understood that lines and spaces may be interchanged depending upon the polarity of the mask supporting the features.

For the purposes of the present invention, the term printed is defined as an actual measurement of a structure on a wafer. The measurement can be performed at any point from formation of a latent image in a photoresist layer to a point after all processing of the wafer is complete. A printed image can be measured optically, by electron microscopy or by electrical measurement.

Optical proximity correction (OPC) rules are designed to optimize the exposure dose (light energy) given the focal properties of an optical lithography system in order to produce printed lines that match the design widths of the lines. A simple example of an OPC rule would state for a given line/space combination (exposed on a given optical lithographic system) the line width on the optical mask should be increased (or decreased) by a specified amount in order to print the designed line width in the photoresist layer.

Sub-resolution assist features (SRAF) are features, too narrow to be resolved by the optical lithographic system, added on either side of a line to improve the sharpness of a line, whether or not it matches the design size. The effect of SRAFs are to make semi-isolated and isolated lines behave more like nested lines (lines in close proximity to one another) since nested lines resolve with better depth of focus (sharper images) then isolated lines in a given optical photolithographic system.

When SRAFs are used, three variables must be controlled. The first is the width of each SRAF. The second is the width of the space between the SRAF and line, and between SRAFS. The third is the number of SRAFs. At one limit, the distance between adjacent lines is too small to put in any SRAFs. At the other limit, a maximum of four SRAFs may be put in (more than four generally adds no improvement in image quality).

Figure 1A:
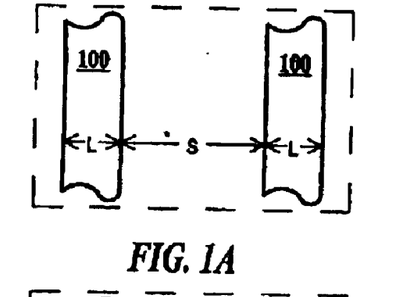
FIGS. 1A through 1H illustrate possible sub-resolution assist features (SRAF) placements according to the present invention.
Figure 1B:
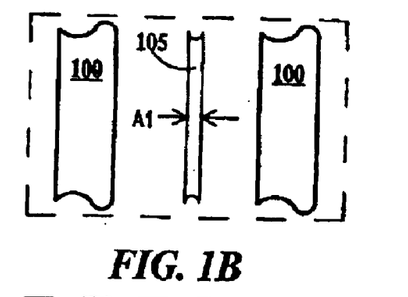
Figure 1C:
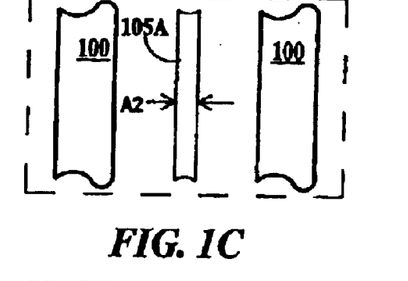
Figure 1D:
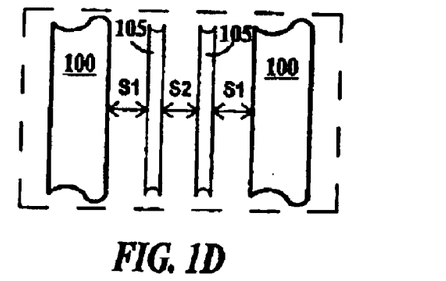
Figure 1E:
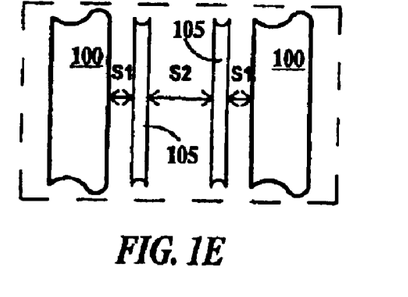
Figure 1F:
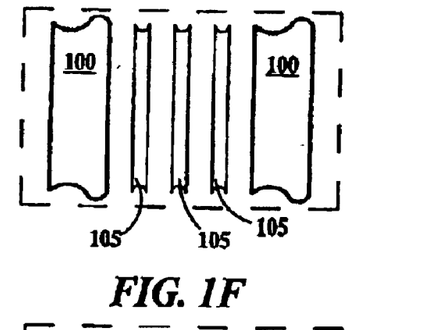
Figure 1G:
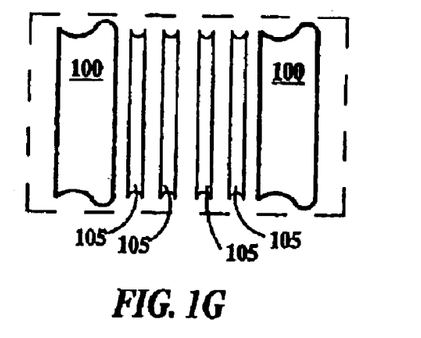
Figure 1H:
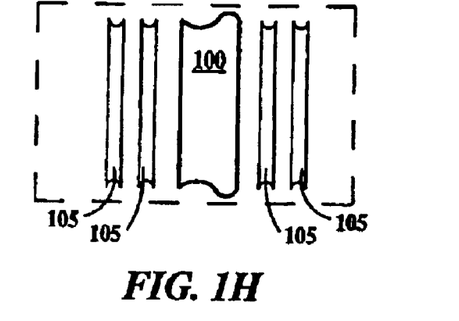

FIGS. 1A through 1H illustrate possible SRAF placements according to the present invention. In FIG. 1A, there are no SRAFs placed between primary lines 100. Lines 100 have a width L and the space between lines 100 has a width S. The values of L and S constitute a line/space combination. In FIG. 1B, there is one SRAF 105 centered between primary lines 100. SRAF 105 has a width A1. In FIG. 1C, there is one SRAF 105A centered between primary lines 100. SRAF 105A has a width A2. SRAF 105A is wider than SRAF 105 in FIG. 1B (i.e. A2 is greater than A1). In FIG. 1D, there are two SRAFs 105 between primary lines 110. The spaces S1 and S2 are equal. In FIG. 1E, there are two SRAFs 105 between primary lines 110. The space S2 is greater than the spaces S1. In FIG. 1F, there are three SRAFs 105 between primary lines 110. In FIG. 1F, The SRAF 105 to SRAF 105 distance and the SRAF 105 to line 100 distance are equal. In FIG. 1G, there are four SRAFs 105 between primary lines 110. In FIG. 1G, SRAF 105 to SRAF 105 distances and the SRAF 105 to line 100 distances are equal. In FIG. 1H, a single isolated line 100 is illustrated with two SRAFs 105 on either side of the line.

In FIGS. 1A through 1H L and S are illustrated as being the same. This is generally not the case. In practice the number, width and placement of SRAFs 105 are rule based, the rules being a function of L and S combinations. L and S are illustrated as being the same because a simulated line/space grating used in development of the present invention was constructed in that manner.

Figure 2:
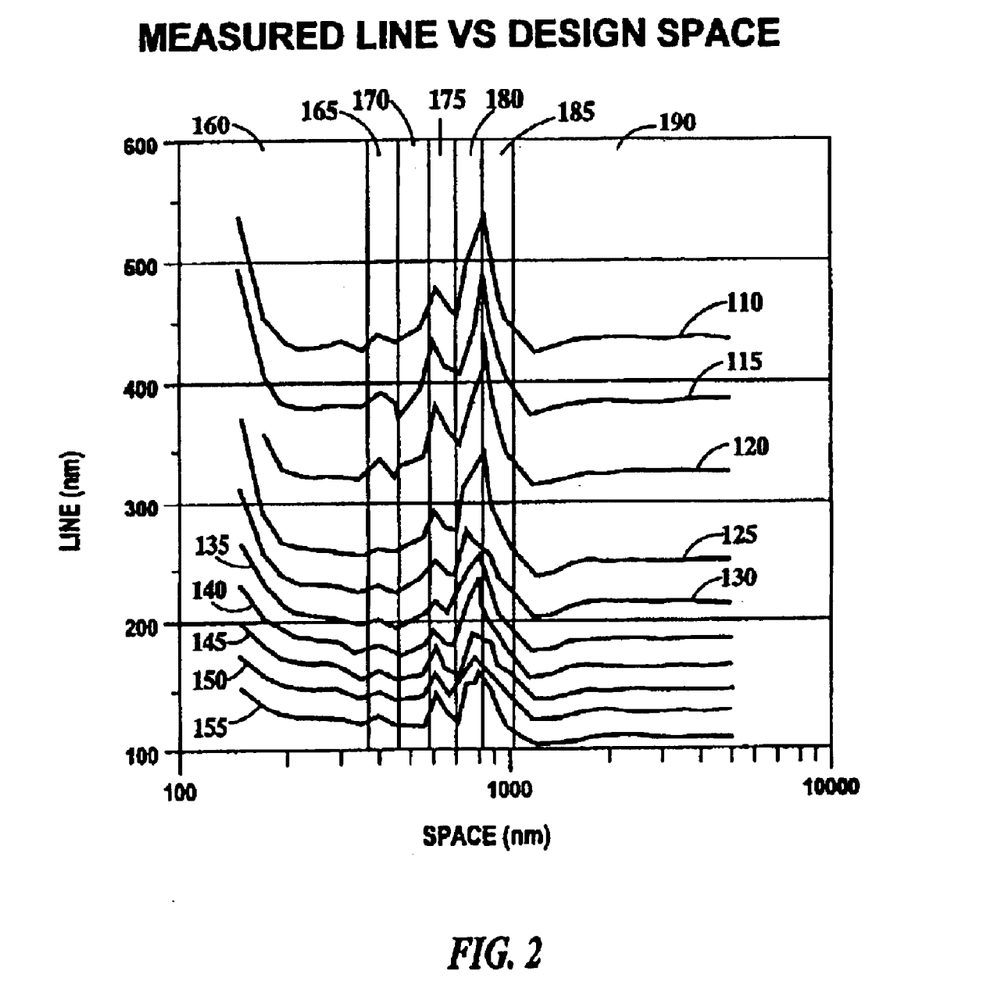
FIG. 2 is a plot of measured image size versus design space illustrating the problem solved by the present invention.

A simulated set of gratings having linewidths (in nm) of 150, 175, 200, 225, 250, 275, 300, 350, 400 and 450 in combination with spacewidths (in nm) of 150, 175, 200, 225, 250 275, 300, 350, 400,450, 500 550, 600, 650, 100, 750, 800, 900, 950, 1000, 1200, 1400, 1600, 1800, 2000, 2500, 3000, 3500, 4000 and 4500 was generated. This set of gratings is exemplary and was used to generate the data illustrated In FIGS. 2, 4, and 5 and described infra. Other line width/spacewidth dimensions and combination may be used. Since there are 10 linewidths and 30031 spacewidths, the grating had 310 line/space pairs. Each grating generally included seven to nine lines (about 2× the optical radius of the of the lithographic system). SRAFs were added to each grating according to a set of rules as illustrated in FIGS. 1A though 1G. Exposure was simulated using an optical lithography system with a numerical aperture (NA) of 0.6 at a wavelength of 248 nm with an annular illumination of 0.75 nm outer and 0.5 nm inner standard deviation. The dose was set for the 150/150 line/space pair. No OPC has been performed. The results are presented in FIG. 2. FIG. 2 is a plot of measured image size versus design space illustrating the problem solved by the present invention. An aerial image simulator was used to simulate exposure of the simulated grating described supra, and to measure the resultant image sizes. In FIG, 2, the measured linewidth versus design space for each set of linewidths is plotted. Curve 110 represents the 31 150/150 to 150/4500 line/space pair sets. Curve 115 represents the 31 175/150 to 175/4500 line/space pair sets. Curve 120 represents the 31 200/150 to 200/4500 line/space pair sets. Curve 125 represents the 31 225/150 to 225/4500 line/space pair sets. Curve 130 represents the 31 250/150 to 250/4500 line/space pair sets. Curve 135 represents the 31 275/150 to 275/4500 line/space pair sets. Curve 140 represents the 31 300/150 to 300/4500 line/space pair sets. Curve 145 represents the 31 350/150 to 350/4500 line/space pair sets. Curve 150 represents the 31 400/150 to 400/4500 line/space pair sets. Curve 155 represents the 31 450/150 to 450/4500 line/space pair sets.

The x or space axis is divided into seven regions: 160, 765, 170, 775, 180, 185 and 190. Each region 160, 765, 170, 175, 180, 185 and 190 corresponds to a different SRAF rule corresponding to FIGS. 1A through 1G respectively. It can be readily seen that curves 110, 115, 120, 125, 130, 135, 140, 145, 150 and 155 are not flat and exhibit a deviation range of 166 nm from design nominal. Application of rule based OPC results in a similar set of curves to those in FIG. 2 with in deviation range of 122 nm. from design nominal, a relatively minor improvement of only 44 nm.

The reason for the failure of rule based OPC to sufficiently correct SRAF designs is that OPC rules are pitch based and assume identical optical environments for all line/space pairs within a pitch set. A pitch set is comprised of all line/space pairs having the same sum of the value of the linewidth added to the spacewidth. However, adding SRAFs results in different line/space pairs having different optical environments. For example, the pitch set of 1000 nm includes the following 4 line/space pairs: 750/250, 600/400, 500/500 and 250/750. The 750/250-line/space pair may have no SRAF, the 600/400-line/space pair may have one SRAF, the 500/500-line/space pair may have one wider SRAF and the 250/750-line/space pair may have two SRAFs. The present invention provides for OPC rules that take into account the presence of SRAFs.

Figure 3:
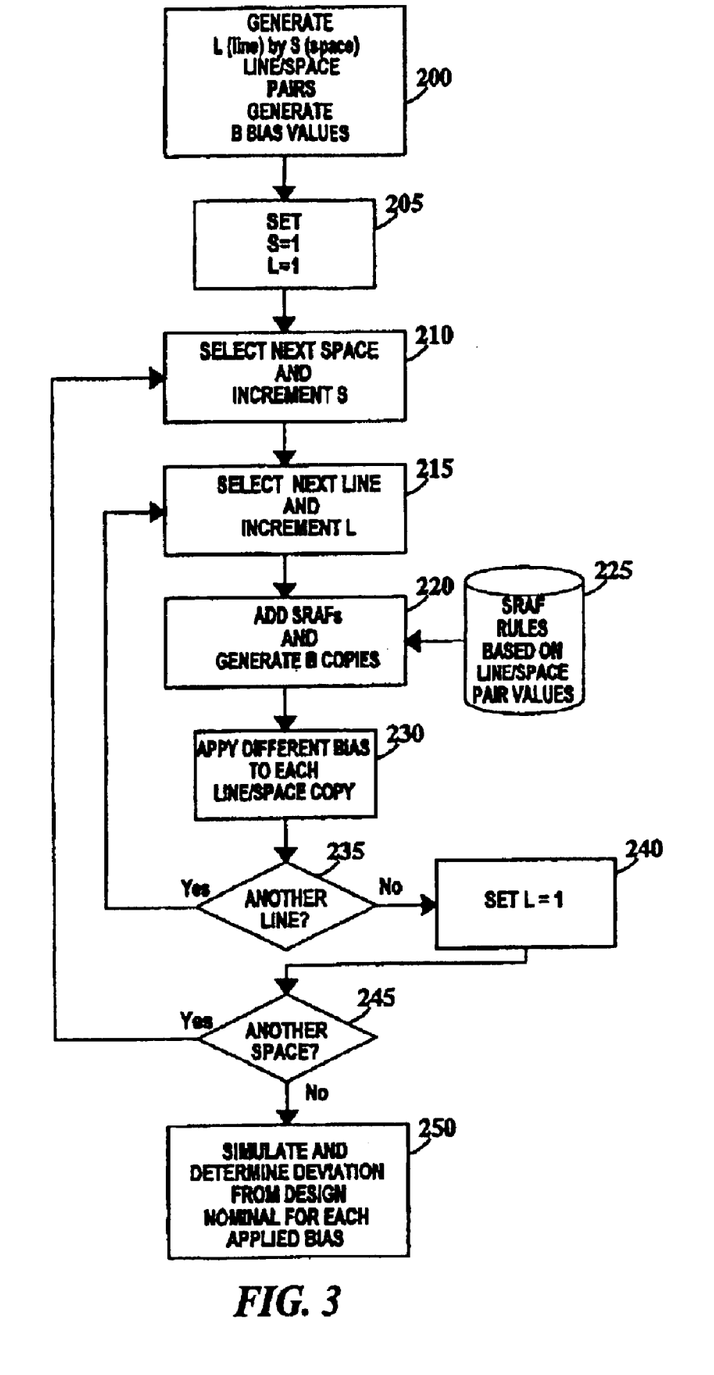
FIG. 3 is a flowchart illustrating a generic method for determining optical proximity correction (OPC) rules according to the present invention.

FIG. 3 is a flowchart illustrating a generic method for determining OPC rules according to the present invention. In step 200, a series of line/space pair sets is generated (e.g. using a real or simulated grating as described supra). There are L different linewidths and S different spacewidths for a total of L times S line/space pairs in S line/space pair sets. Line space/pair sets are designated as groups of line/space pairs having a common spacewidth. The line/space pairs cover the full range of design options of an integrated circuit. Also in step 200, a set of bias values to apply to each linewidth is generated. There are B different bias values. Bias values include negative, zero and positive values. The B bias values selected cover the full range of OPC values that the design/optical system would require.

In step 205, counters S (for line/space set) and L (for linewidth within the line/space set) are initialized to 1. In step 270, the next line/space set is selected (and S is incremented by 1). In step 275, the next linewidth L in line/space set S is selected, after which the L counter is incremented by 1. In step 220, SRAFs are added to the current line/space pair based on SRAF rules 225. SRAF rules 225 are line/space based as discussed supra. Also, in step 220, B copies of the line/space pair with SRAFs (if any) are generated.

Figure 4:
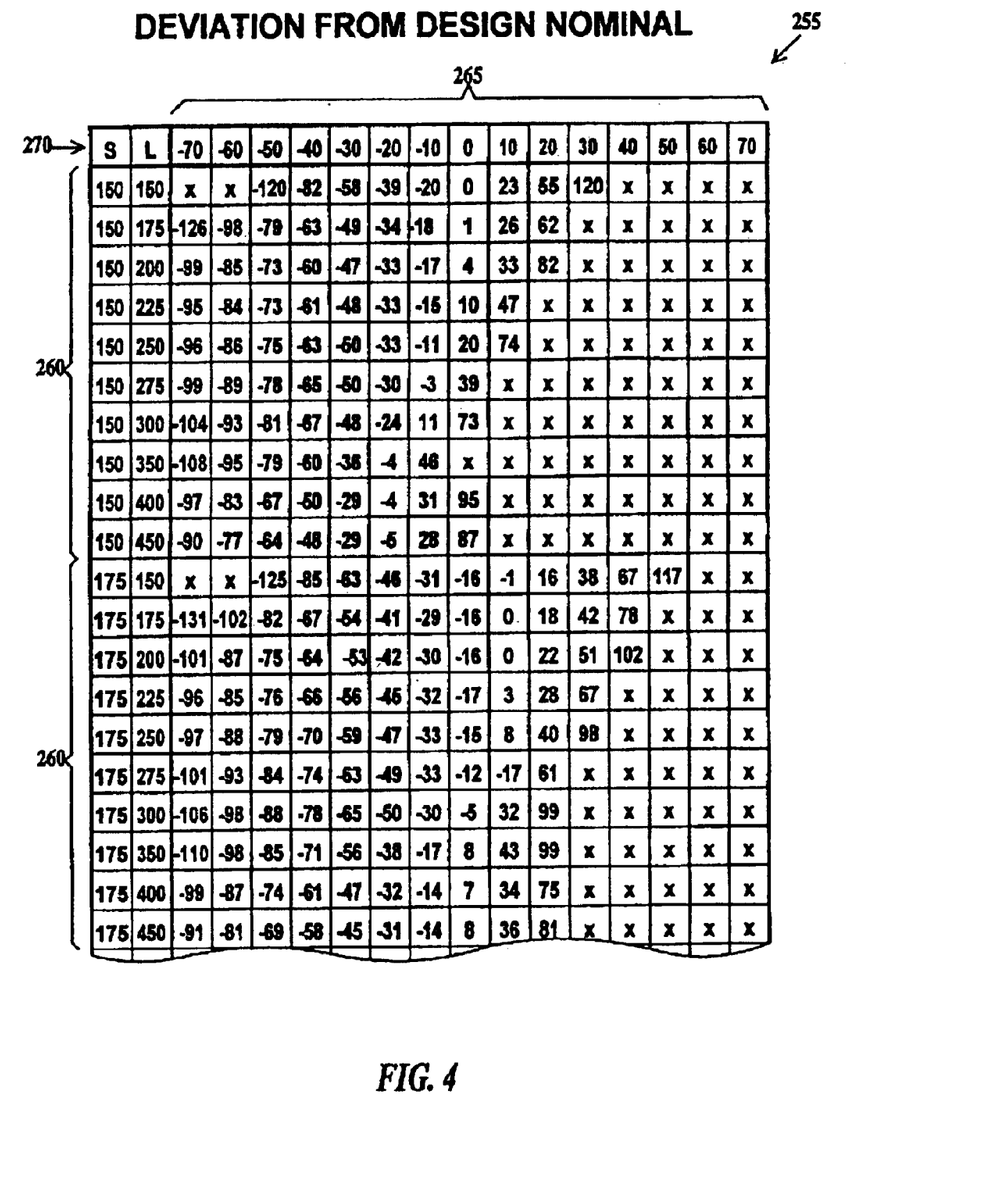
FIG. 4 is a table Illustrating exemplary data generated by the present invention that is used to create exemplary OPC rules according to the present invention.

In step 230, a different bias (as generated in step 200) is applied to each line/space copy. The bias is applied only to the line and not to any SRAFs. The key feature of the sequence is SRAFs are always applied to lines having zero applied bias before applying bias to those lines. In step 235 it is determined if there is another line/space pair (another line value) in the current line/space pair set. If there is then the method loops to step 215, if not the method proceeds to step 240 where the L counter is reset to 1. Next, in step 245, it is determined if all line/space sets have been processed. If not, the method loops to step 270. If all line/space sets have been processed than in step 250, the all the line/space pairs are printed either real or simulated (there are L×S×B line/space pairs), and the deviation of each lines linewidth in each line/space pair from the designed linewidth for that line is determined. When this data is arranged in a matrix sorted vertically first by spacewidth and then by linewidth and horizontally by bias, a table is produced from which OPC rules that are corrected for SRAFs may be calculated. This may be more easily seen by reference to FIG. 4. The table illustrated in FIG. 4 was derived using the simulated grating describe supra and the method illustrated in FIG. 3 and described supra. FIG. 4 is a table illustrating exemplary data generated by the present invention that is used to create exemplary OPC rules according to the present invention. In FIG. 4, matrix 255, the S column indicates the design width of the space in the line/space pair and the L column indicates the design width of the line in the line/space pair. Since the first sort is by space, the matrix is arranged in sets of line/pairs 260 having a common design space width. Columns 265 are sorted from most negative bias to most positive bias applied to the line of each row (see step 230 of FIG. 3). In the present example, the bias ranges from 31 70 nm to 70 nm in 10 nm increments. The applied bias is indicated in a header row 270. The value in each cell of matrix 255 (excluding the L and S columns and header row 270) is the deviation from design of the printed line. The actual data in FIG. 4 was generated by simulation using the simulated set of gratings and SRAFs described supra. An x indicates that there was no solution to the aerial image. The OPC rule for each line/space pair is determined from a x-y plot of applied bias (row 270) along the y-axis and the deviation of linewidth from design for a given line/space pair along the x-axis. The x-intercept of the resultant curve is the amount of OPC correction to be applied to that line/space pair when SRAFs have been incorporated into the design. Of course, actual plots need not be made, and any number of types of curve fitting algorithms may be used to find the most accurate x-intercept. In the present example, the OPC bias that should be applied to a line described by line/space pair 150/300 would be 31 13 nm.

Figure 5:
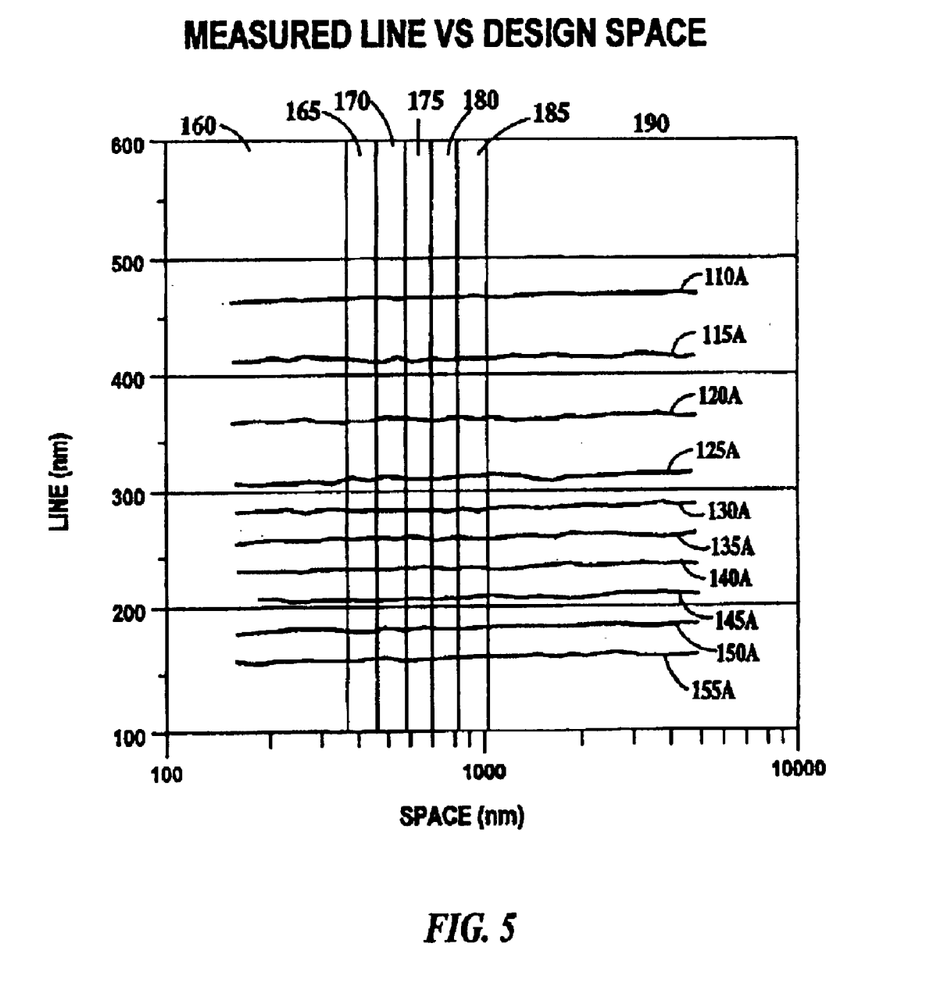
FIG. 5 is a plot of measured image size versus design space illustrating the improvement provided by the present invention.

FIG. 5 is a plot of measured image size versus design space illustrating the improvement provided by the present invention. The same aerial image simulator as used supra was used to simulate exposure of the simulated grating after processing the grating as illustrated in FIG. 3 and described supra. In FIG. 5, the measured line width versus design space for each set of linewidths is plotted. Curve 110A represents the 31 150/150 to 150/4500 line/space pair sets. Curve 115A represents the 31 175/150 to 175/4500 line/space pair sets. Curve 120A represents the 31 200/150 to 200/4500 line/space pair sets. Curve 125A represents the 31 225/150 to 225/4500 line/space pair sets. Curve 130A represents the 31 250/150 to 250/4500 line/space pair sets. Curve 135A represents the 31 275/150 to 275/4500 line/space pair sets. Curve 140A represents the 31 300/150 to 300/4500 line/space pair sets. Curve 145A represents the 31 350/150 to 350/4500 line/space pair sets. Curve 150A represents the 31 400/150 to 400/4500 line/space pair sets. Curve 155A represents the 31 450/150 to 450/4500 line/space pair sets.

It can be readily seen that curves 110A, 115A, 120A, 125A, 130A, 135A, 140A, 145A, 150A and 155A are very flat and exhibit a very small deviation range from design nominal of less than 4 nm.

Figure 6:
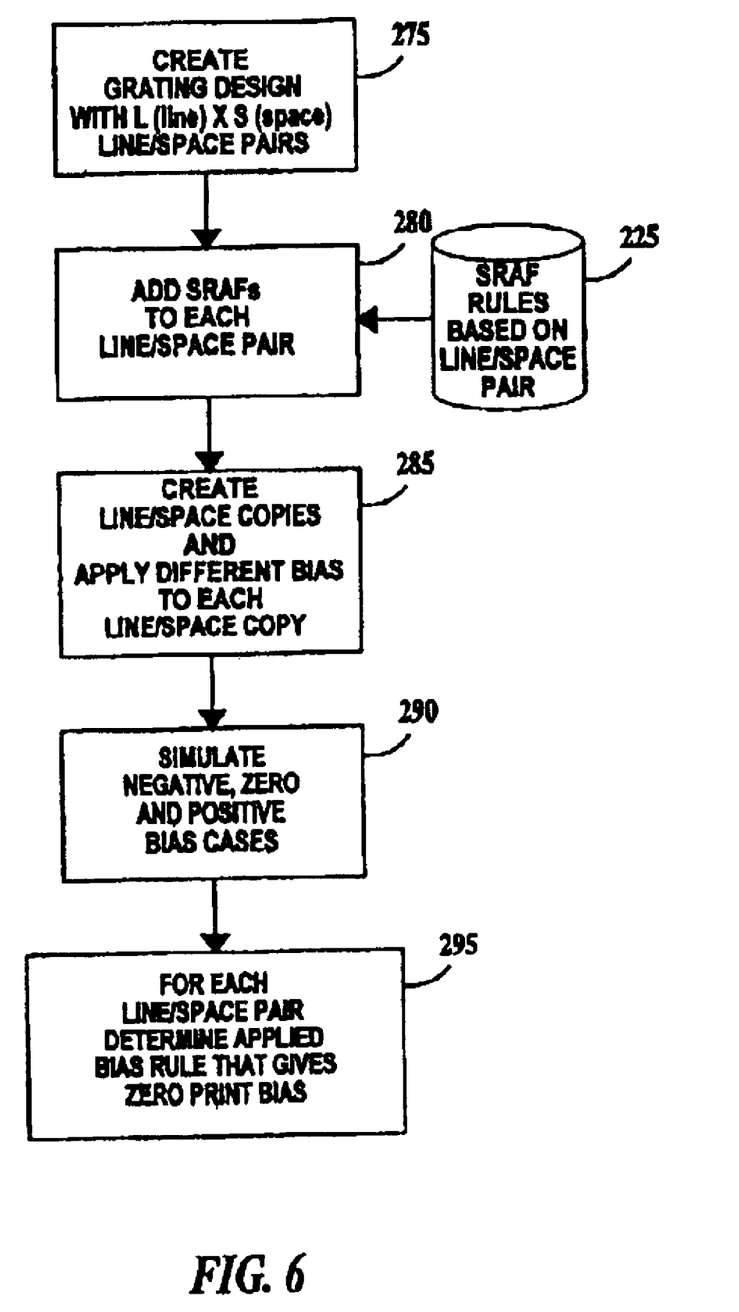
FIG. 6 is a flowchart of a first embodiment of the present invention.

FIG. 6 is a flowchart of a first embodiment of the present invention. In the first embodiment of the present invention, all OPC biases are determined using simulation only. In step 275, a design grating is created having L times S line/space pairs. The line/space pairs cover the full range of design options of an integrated circuit. In step 280, SRAFs are added to the current line/space pair based on SRAF rules 225. In step 285, in simulation copies of the line/space pair with SRAFs (if any) are generated. Also, in step 285, in simulation a different bias is applied to the line in each copy of each line/space pair. The biases include negative, zero and positive values. The bias values selected cover the full range of OPC values that the design/optical system would require. Steps 275, 280 and 285 are similar to steps 200, 205, 210, 215, 220, 230, 235, 240 and 245 of FIG. 3.

Figure 7:
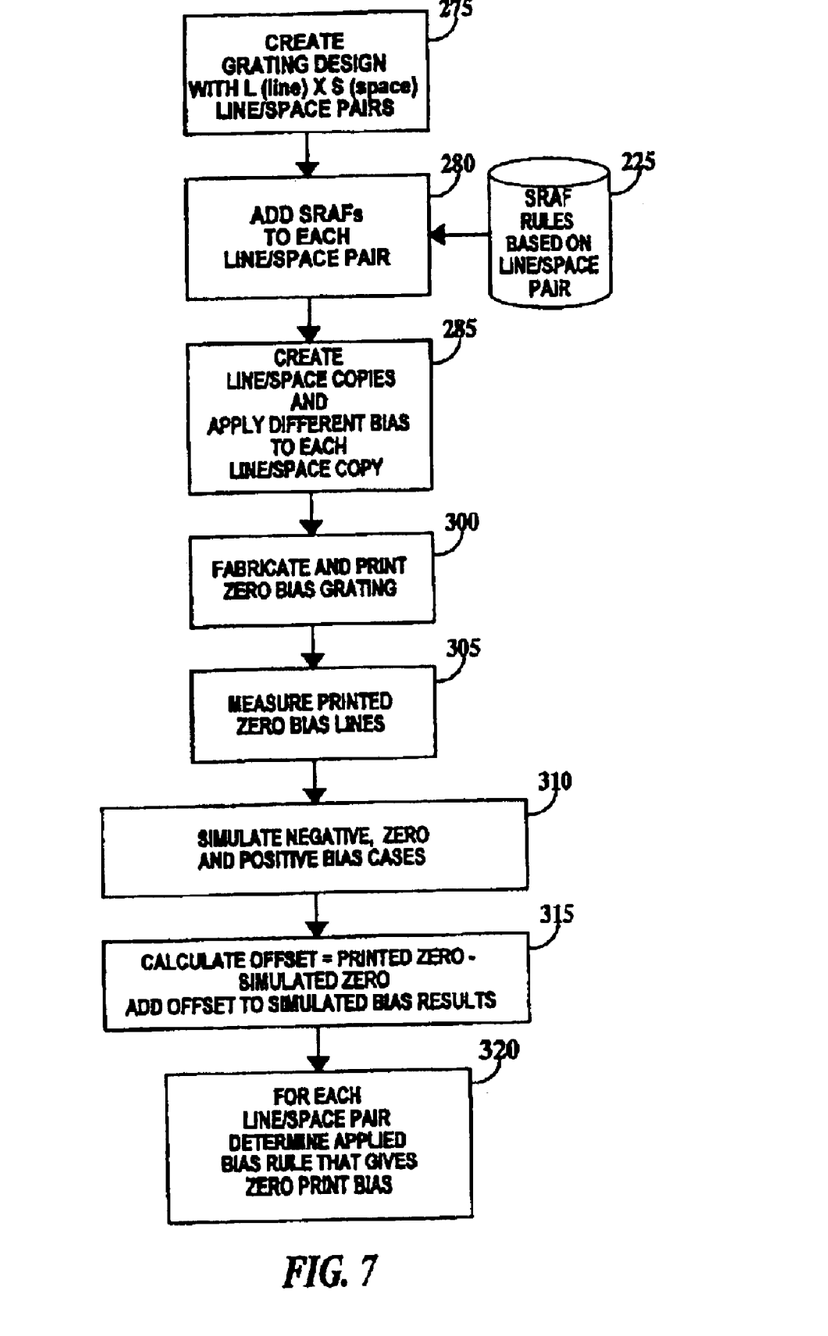
FIG. 7 is a flowchart of a second embodiment of the present invention.

In step 290 the negative, zero and positive bias cases (that is all cases) are simulated and the simulated deviation of each line width of each copy of each line/space pair from design is determined. In step 295, an OPC bias rule for each line/space pair is determined as described supra in reference to FIG. 4, that is, by determining the x-intercept of the deviation of each simulated line width of each copy of each line/space pair from design versus applied bias. FIG. 7 is a flowchart of a second embodiment of the present invention. In the second embodiment of the present invention, all OPC biases are determined using a combination of simulation and actual printing and measurement. Essentially steps 290 and 295 of FIG. 6 are replaced with steps 300, 305, 310, 315 and 320 in FIG. 7. Since steps, 275, 280 and 285 are repeated in FIG. 7, they will not be discussed further.

After step 285, step 300 is performed. In step 300, a zero bias grating is fabricated and printed. (The copies are made and multiple biases are still applied in step 285, but that is in simulation). In step 305, the printed lines are measured.

In step 310, the negative, zero and positive bias cases (that is all cases) are simulated and the deviation of each simulated line width of each copy of each line/space pair from design is determined. Then in step 315, an offset between the printed zero bias line widths and the simulated zero bias line widths is determined. This offset is applied to each simulated bias for all line/space pairs. In step 320, an OPC bias rule for each line/space pair is determined as described supra in reference to FIG. 4, that is, by determining the x-intercept of the deviation of each simulated line width (after applying the offset correction) of each copy of each line/space pair from design versus applied bias. Steps 300, 305, 310 and 315 in effect correct the simulation without requiring the more complex mask required by the third embodiment.

Figure 8:
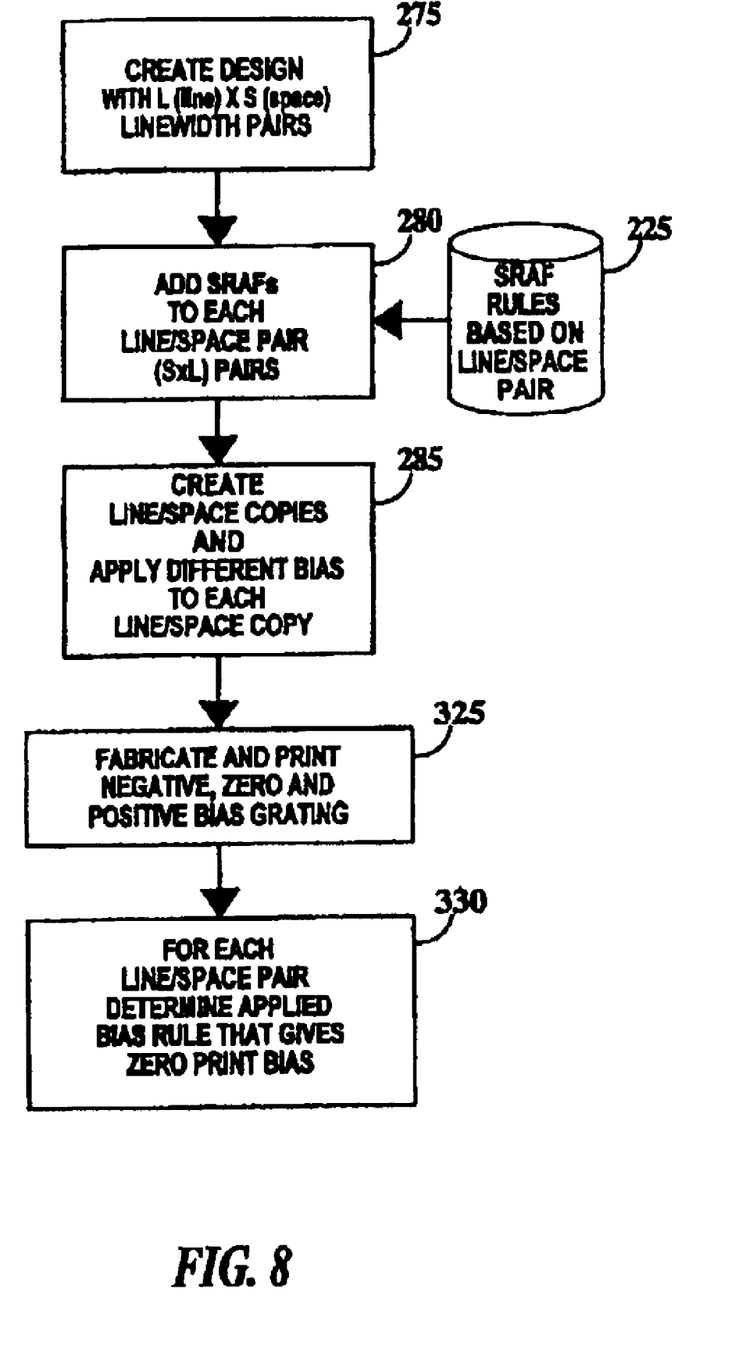
FIG. 8 is a flowchart of a third embodiment of the present invention.

FIG. 8 is a flowchart of a third embodiment of the present invention. In the third embodiment of the present invention, all OPC biases are determined using only actual printing and measurement. Essentially, steps 290 and 295 of FIG. 6 is replaced by steps 320 and 325 in FIG. 8. Since steps, 275, 280 and 285 are repeated in FIG. 8, they will not be discussed further.

Figure 9:
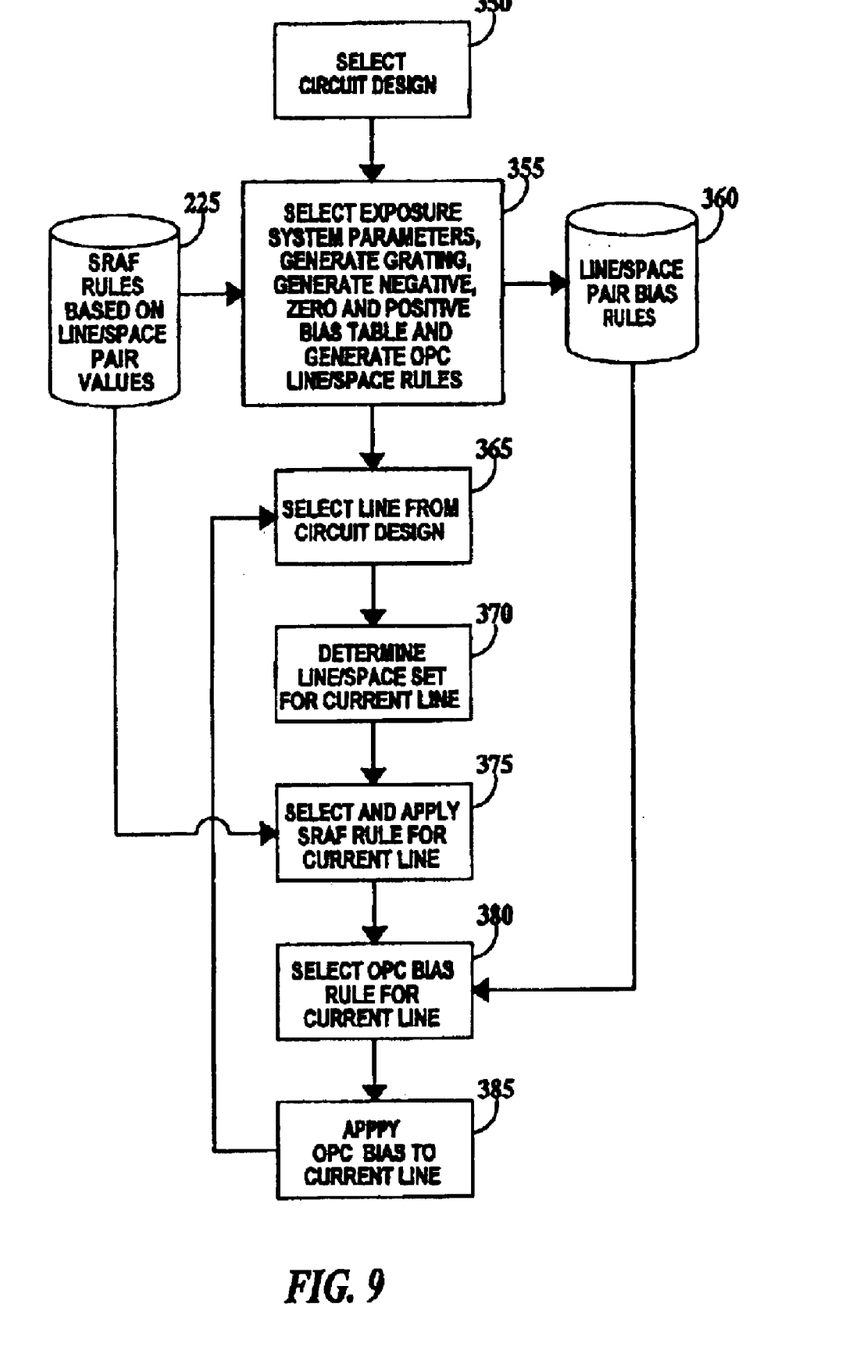
FIG. 9 is a flowchart illustrating creation of an optical mask according to the present invention.

After step 285, step 325 is performed. In step 325, a mask having grating sets for the negative, zero and positive bias cases (that is all cases) is fabricated and the printed deviation of each line width of each copy of each line/space pair from design is determined. In step 330, an OPC bias rule for each line/space pair is determined as described supra in reference to FIG. 4, that is, by determining the x-intercept of the deviation of each printed line width of each copy of each line/space pair from design versus applied bias. FIG. 9 is a flowchart illustrating creation of an optical mask according to the present invention. FIG. 9 illustrates fabrication of an opaque layer on a glass mask according to the present invention wherein the lines of each line/space pair are fabricated in chrome. Opaque layers may be fabricated from, for example, chrome, or light blocking material. Light attenuating materials may be substituted for opaque material and combinations of layers may be used. In step 350, a circuit design is selected. The circuit design determines the range of line/width pairs and OPC bias that will be required. In step 355, an exposure system and exposure parameters are determined. A simulated or actual grating having SRAFs (from SRAF rules 225) is generated, a negative, zero and positive bias versus linewidth deviation table is generated and line/space pair based OPC rules 360 are generated. Step 355 may employ any of the three embodiments of the present invention as illustrated in FIGS. 6, 7 and 8 and described supra. In step 365, a line (design feature) is selected from the circuit design selected in step 350. In step 310, the line/space pair is determined for the current line. In step 375 the SRAFs (if any) are selected from SRAF rules 225 and applied to the line. In step 380 the OPC bias to apply to the line is selected from OPC line/space pair rules 360 and in step 385, the OPC is applied to the line. Steps 365, 310, 375, 380 and 385 are repeated until all lines in the circuit design are corrected.

The data generated/used in the methods of the invention are preferably embodied/stored in a computer and/or computer-readable medium, and the steps of the invention are preferably performed using a computer.

The invention also encompasses systems and/or apparatus for carrying out the various method(s) of the invention. For example, the invention encompasses systems and/or apparatus for determining an optical proximity correction for a primary feature having sub-resolution assist features for increasing the depth of focus of the primary features, comprising: (a)means for generating data describing a line/space pair; (b) means for generating data describing placement of sub-resolution assist features on opposite sides of the line of the line/space pair; (c)means for generating data describing a set of linewidth biases; (d)means for generating data describing a set of biased-line/space pairs by applying the data describing a set of linewidth biases to a portion of the data describing a line/space pair that corresponds to the line of the line/space pair; (e)means for generating data describing for each biased-line/space pair, a deviation from a design linewidth of the line/space pair when the set of biased-line/space pairs are printed or simulated; and (f)means for generating data describing a correction bias to apply to the line of the line/space pair based on the data describing the deviation.

Means (a)–(f) preferably comprises executable code stored in a computer readable medium and a computer capable of executing the code. The system may further include a means for input/output of data and/or interfacing with other software/computers used for generation of mask layout data.

The invention also encompasses computer programs stored in a computer-readable medium for carrying out the method(s) of the invention. For example, the invention encompasses computer programs having computer-executable code for: (a) generating data describing a line/space pair; (b)generating data describing placement of sub-resolution assist features on opposite sides of the line of the line/space pair; generating data describing a set of linewidth biases; (d) generating data describing a set of biased-line/space pairs by applying the data describing a set of linewidth biases to a portion of the data describing a line/space pair that corresponds to the line of the line/space pair; (e) generating data describing for each biased-line/space pair, a deviation from a design linewidth of the line/space pair when the set of biased-line/space pairs are printed or simulated; and (f) generating data describing a correction bias to apply to the line of the line/space pair based on the data describing the deviation.

The invention also encompasses a computer program stored in a computer-readable medium, the program performing a method of determining a set of optical proximity correction rules for primary features having sub-resolution assist features for increasing the depth of focus of the primary features, the program comprising computer-executable code for: (a) generating data describing a grating, the grating comprising sets of sets of line/space pairs, each set of line space/pairs comprising multiple copies of a unique combination of a linewidth value and a spacewidth value; (a) generating data describing a set of linewidth biases; (b) for data describing each line/space pair of a particular set of line/space pairs; (i) selecting data describing a sub-resolution assist features from data describing a set of sub-resolution assist features based on the spacewidth value of the line/width pair of the particular set of line/space pairs; (ii) generating data describing placement of the selected sub-resolution assist features on either side of each line of each line/space pair of the particular set of line/space pairs; and (iii) generating data describing a biased-line/space pair by applying data describing a different one of the set of linewidth biases to a portion of the data describing a line/space pair that corresponds to the line of the line/space pair; (c) generating data describing deviations from design linewidths of the respective biased line/space pairs; and(d) generating data describing the set of optical proximity correction rules from the deviations.

The invention also encompasses a computer program stored in a computer-readable medium, the program performing a method of optical proximity correction of primary features of a design having sub-resolution assist features for increasing the depth of focus of the primary features during operation of an optical lithography system by width biasing a light blocking layer on an optical mask, comprising: (a) selecting data describing a set of line/space pairs representative of each feature; (b) for each line/space pair of the set of line/space pairs; (i) generating data describing an identical set of line/space pairs representative of the feature; (ii) generating data describing placement of sub-resolution assist features on opposite sides of each line of each line/space pair, the selection of the sub-resolution assist features being on linewidth and space values of the line/space pair; (iii) generating data describing a set of linewidth biases; (iv) generating data describing a biased-line/space pair by applying data for a different linewidth bias of the set of linewidth biases to the line of each line/space pair to generate a set of biased-line/space pairs; (v) generating data describing, for each biased-line/width pair, a deviation from a design linewidth of the line/space pair when the set of biased-line/space pairs are printed or simulated; and (vi) generating data, from the deviations, describing the set of optical proximity correction rules corresponding to each line/space pair, each rule comprising a correction bias; (c) selecting data describing a selected primary feature; (d) determining a corresponding line/space pair from the set of line/space pairs representative of the selected primary feature; (e) generating data describing placement of sub-resolution assist features on opposite sides of the selected primary feature, selection of the sub-resolution assist feature being based on linewidth and space values of the line/space pair representative of the feature; (f) selecting data describing a selected correction bias from the set of optical proximity correction rules, selection of the correction bias based on linewidth and space values of the line/space pair representative of the feature; and (g) applying the data for the selected correction bias to the data describing the selected feature the course of use, the computer programs of the invention may be resident in a computer which is part of a tool for design/generation of mask layout data. Alternatively, the programs of the invention may be in some other computer-accessible form (e.g., on separate computer, on portable computer-readable media (e.g., magnetic disk, hard drive, compact disk, etc.).

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of determining an optical proximity correction for a primary feature having sub-resolution assist features for increasing the depth of focus of said primary features, comprising:

generating a line/space pair;

placing sub-resolution assist features on opposite sides of the line of said line/space pair;

generating a set of linewidth biases;

applying said set of linewidth biases to the line of said line/space pair to generate a set of biased-line/space pairs;

determining for each biased-line/space pair, a deviation from a design linewidth of said line/space pair when said set of biased-line/space pairs are printed or simulated; and determining from said deviation a correction bias to apply to the line of said line/space pair.

2. The method of claim 1, wherein the step of placing sub-resolution assist features next to said line/space pair is performed before the step applying said set of linewidth biases to the line of said line/space pair.

3. The method of claim 1, wherein said set of linewidth biases includes zero bias and biases of positive and negative multiples of a constant value.

4. The method of claim 1, wherein the step of determining from said deviation a correction bias to apply to the line of said line/space pair includes determining a correction bias that results in substantially zero deviation.

5. The method of claim 1, wherein the step of determining from said deviation a correction bias includes generating a function of said deviation versus said set of applied linewidth biases and solving said function for the correction bias having zero deviation.

6. The method of claim 1, further including applying said correction bias to the line of said line/space pair.

7. A method of determining a set of optical proximity correction rules for primary features having sub-resolution assist features for increasing the depth of focus of said primary features, comprising:

generating a grating, said grating comprising sets of sets of line/space pairs, each set of line space/pairs comprising multiple copies of a unique combination of a linewidth value and a spacewidth value;

generating a set of linewidth biases;

for each line/space pair of a particular set of line/space pairs;

selecting a sub-resolution assist features from a set of sub-resolution assist features based on said spacewidth value of said line/width pair of said particular set of line/space pairs;

placing said sub-resolution assist features on either side of each line of each line/space pair of said particular set of line/space pairs; and applying a different linewidth bias of said set of linewidth bias to each line of each line/space pair of said particular set of line/space pairs;

determining deviations from design linewidths of said sets of line/space pairs produced by said applying said different linewidth bias of said set of linewidth bias to each line of each line/space pair of said particular set of line/space pair; and generating from said deviations from said design linewidths of said set of line/space pairs said set of optical proximity correction rules.

8. The method of claim 7, wherein the step of determining deviations from design linewidths of said sets of line/space pairs includes measuring simulated linewidths of each line/space pair of each set of line/space pairs after adding said sub-resolution assist features and said application of said linewidth biases.

9. The method of claim 7, wherein the step of determining deviations from design linewidths of said sets of line/space pairs includes measuring printed linewidths of each line/space pair of each set of line/space pairs after adding said sub-resolution assist features and said application of said linewidth biases.

10. The method of claim 7, wherein the step of placing sub-resolution assist features next to said line/space pair is performed before the step applying said different linewidth bias to each line of said line/space pairs.

11. The method of claim 7, wherein said set of linewidth biases includes zero bias and biases of positive and negative multiples of a constant value.

12. The method of claim 11 wherein the step of determining deviations from design linewidths of said sets of line/space pairs includes:
- measuring printed linewidths of each line/space pair of each set of line/space pairs after adding said sub-resolution assist features and application of said zero bias to each line of said line/space pairs in order to generate a printed zero bias measurement set;
- measuring simulated linewidths of each line/space pair of each set of line/space pairs after adding said sub-resolution assist features and said application of said linewidth biases in order to generate a simulated bias measurement set for each linewidth bias of said set of linewidth biases;
- calculating a set of offsets as the difference between said printed zero bias measurement set and said simulated bias measurement sets; and
- adding said set of offset to said deviations.

13. The method of claim 7, wherein the step of determining from said deviations a linewidth bias to apply to said line/space pair includes determining a linewidth bias that results in substantially zero deviation.

14. The method of claim 7, wherein the step of determining deviations from design linewidths includes generating for each said line/space pair, a function of said deviations versus said set of applied linewidth biases and solving said function for a correction bias having zero deviation for each said line/space pair.

15. A method of optical proximity correction of primary features of a design having sub-resolution assist features for increasing the depth of focus of said primary features during operation of an optical lithography system by width biasing a light blocking layer on an optical mask, comprising:
- (a) selecting a set of line/space pairs representative of each said feature;
- (b) for each line/space pair of said set of line/space pairs;
  - (i) generating, an identical set of line/space pairs representative of said feature;
  - (ii) placing sub-resolution assist features on opposite sides of each line of each line/space pair, selection of said sub-resolution assist features based on linewidth and space values of said line/space pair;
  - (iii) generating a set of linewidth biases;
  - (iv) applying said a different linewidth bias of said set of linewidth biases to the line of each line/space pair to generate a set of biased-line/space pairs;
  - (v) determining for each biased-line/width pair, a deviation from a design linewidth of said line/space pair when said set of biased-line/space pairs are printed or simulated; and
  - (vi) determining from said deviations, a set of optical proximity correction rules corresponding to each line/space pair, each rule comprising a correction bias; selecting a feature from said primary features;
- (d) determining a corresponding line/space pair from said set of line/space pairs representative of said feature;
- (e) placing sub-resolution assist features on opposite sides of said feature, selection of said sub-resolution assist feature based on linewidth and space values of said line/space pair representative of said feature;
- (f) selecting a correction bias from said set of optical proximity correction rules, selection of said correction bias based on linewidth and space values of said line/space pair representative of said feature; and
- (g) applying said correction bias to said feature.

16. The method of claim 15, wherein the step of placing sub-resolution assist features next to said line/space pair is performed before the step applying said different linewidth bias to said line/space pair.

17. The method of claim 15, wherein said set of linewidth biases includes zero bias and biases of positive and negative multiples of a constant incremental value.

18. The method of claim 15, wherein the step of determining from said deviations a linewidth bias to apply to said line/space pair includes determining a linewidth bias that results in substantially zero deviation.

19. The method of claim 15, wherein the step of determining from said deviations a linewidth bias includes generating a function of said deviations versus said set of applied linewidth biases and solving said function for the correction bias having zero deviation.

20. The method of claim 15, wherein said feature are lines including material selected from the group consisting of chrome, light attenuating material, light blocking material and combinations thereof.

21. A computer program in a computer readable medium, said program comprising computer-executable code for carrying out the steps of claim 1.

22. A computer program in a computer readable medium, said program comprising computer-executable code for carrying out the steps of claim 7.

23. A computer program in a computer readable medium, said program comprising computer-executable code for carrying out the steps of claim 15.

* * * * *